United States Patent [19]

Benschop

[11] Patent Number: 4,567,386
[45] Date of Patent: Jan. 28, 1986

[54] INTEGRATED LOGIC CIRCUIT INCORPORATING FAST SAMPLE CONTROL

[75] Inventor: Nico F. Benschop, Eindhoven, Netherlands

[73] Assignee: U.S. Philips Corporation, New York, N.Y.

[21] Appl. No.: 520,382

[22] Filed: Aug. 4, 1983

[30] Foreign Application Priority Data

Aug. 10, 1982 [NL] Netherlands ............... 8203148

[51] Int. Cl.$^4$ ............... H03K 19/096; H03K 19/017; H03K 19/20
[52] U.S. Cl. ............... 307/481; 307/450; 307/453; 377/79; 377/105
[58] Field of Search ............... 307/450, 452, 453, 481, 307/480; 377/78, 79, 104, 105, 117, 106

[56] References Cited

U.S. PATENT DOCUMENTS

| | | |
|---|---|---|
| 3,497,715 | 2/1970 | Yen .................................. 307/481 |
| 3,518,451 | 6/1970 | Booher ........................... 307/481 X |
| 3,601,627 | 8/1971 | Booher ........................... 307/481 |
| 3,740,576 | 6/1973 | Haraszti ........................ 377/79 X |
| 3,747,064 | 7/1973 | Thompson ...................... 307/481 |
| 3,883,802 | 5/1975 | Puri ................................ 307/481 X |
| 3,965,369 | 6/1976 | Hatsukano .................... 307/481 X |
| 4,291,247 | 9/1981 | Cooper, Jr. et al. ............. 307/481 |

Primary Examiner—Larry N. Anagnos
Attorney, Agent, or Firm—Robert T. Mayer; Steven R. Biren

[57] ABSTRACT

A MOS integrated logic circuit is described which comprises a plurality of groups (61, 63, 65, 67, 69) of combinatory logic elements. These groups form a cascade in that a data output of a preceding group is directly coupled to a data input of a next group within the cascade. During successive clock pulse phases the groups of combinatory logic elements are sampled in the sequence in which they are arranged in the cascade. Charging means provide the charge to be sampled, either by means of a precharge clock phase, or by virtue of being pull-up means.

5 Claims, 9 Drawing Figures

INTEGRATED LOGIC CIRCUIT INCORPORATING FAST SAMPLE CONTROL

BACKGROUND OF THE INVENTION

The invention relates to a multi-phase MOS integrated circuit comprising a plurality of groups of combinatory logic elements for forming an associated AND/OR/INVERSION function in each group, at least one data connection of each group of combinatory logic elements being coupled to a data connection of at least one of the other groups, said integrated circuit comprising clock inputs for receiving the signals of a multi-phase clock-pulse cycle having a plurality of clock pulses, at least one clock pulse per cycle controlling a sample operation. An integrated circuit of this kind is known from previous Netherlands Patent Application No. 7809397 (corresponding to U.S. Pat. No. 4,371,795). The known circuit is an example of dynamic MOS logic, which is typified by the fact that no direct current can occur between the power terminals. For the design of very large scale integrated circuits (VLSI), an optimum compromise is sought for three characteristic variables, that is to say power dissipation, the delay time required for a given logic operation, and the surface area required for given function; all these variables should be as low as possible. All known technologies have their specific relative drawbacks.

Herein, combinatory logic elements are to be understood to mean elements in which a transition of an input signal causes a signal transition on the output or not, regardless of the instant of occurrence of the former transition. In sequential logic elements of separation exists between input and output: when a signal transition on the input occurs prior to a given instant, this signal transition can influence the output signal. If the signal transition on the input occurs later, the output signal will remain the same at least for the time being. Herein an AND/OR/INVERSION function is to be understood to mean a function which comprises an arbitrary combination of AND-functions and OR-functions, followed by an inherent inversion. Herein a data connection is to be understood to mean a data input as well as a data output. In the cited dynamic MOS technology, the logic operations are performed in a succession of clock cycles. Upon the transition between two successive clock cycles the resultant signals are temporarily stored in hold circuits. This offers the logic designer a high degree of freedom, but also results in a comparatively slow circuit because the number of logic levels or logic depth of the function which can be formed per clock cycle is limited.

SUMMARY OF THE INVENTION

It is an object of the present invention to accelerate the transfer of the signals between successive groups of combinatory logic elements without direct technological improvements being required, that is to say to concentrate the plurality of precharge operations within a small time interval.

The object is achieved in that a circuit in accordance with the invention comprises charge procuring means for charging a second plurality of nodes, and in that the circuit has a third plurality of clock inputs for receiving associated clock pulses during successive clock pulse phases as sample clock pulses for associated successive groups, the sample operations for the groups which are connected in a cascade by way of a direct coupling of a data output of a preceding group within said first plurality to a data input of a next group within said first plurality, so that within a clock pulse cycle a preceding group in the cascade is always sampled in an earlier phase than a next group in the cascade. The higher processing speed is achieved at the expense of some flexibility, because all groups within the first plurality of groups must be arranged in the cascade. If desirable, several of such cascades may be linked or cascade outputs may be fed back to cascade inputs.

Preferably, said charge procuring means are constituted by precharge transistors for precharging associated nodes in a precharge clock phase. If the precharge clock phase is not concurrent with any sample clock phase within the plurality of groups, this amounts to dynamic logic, with its associated low power dissipation. Viewed in time, this system has parallel precharging and successive sampling operations.

Alternatively, the charge procuring means are constituted by respective pull-up means for connecting associated nodes to a common voltage terminal. Such pull-up means have the function of a current source, and are realized, for example, by a resistor, or by a pull-up transistor. In effect the circuit has static aspects, because a node may now be sampled concurrently with the activity of the pull-up means. The dissipation is somewhat higher, but control is simplified. Moreover, because data is not held at a floating node, no "charge-sharing" may occur.

Preferably, the clock inputs are suitable to receive clock signals whose further phases succeed one another with mutual time differences whose durations correspond substantially to the length of a leading edge of the signal of the relevant further phase. It has been found that the clock cycle can thus be substantially reduced for the same chain of combinatory logic operations. Evidently, one clock pulse phase, notably the last phase, may contain more than just a leading edge.

Preferably, the circuit is constructed in nMOS-technology. The invention then offers an attractive solution, even though it can also be advantageously used in pMOS-technology in given cases.

The circuit will usually be constructed so that the combinatory logic elements of a group are connected between the precharge node (=capacitance) of this group and the sample transistor associated with this group. In given cases it will be advantageous to connect a sample transistor for at least one group between the precharge node and the combinatory logic elements of this group. For some applications a greater logic depth can be achieved within such a group of combinatory logic elements by series connection of two AND/OR-/INVERSION functions. In that case however, a slight increase of the time interval until the beginning of the next phase of the clock pulse cycle will be necessary for this group of combinatory logic elements.

Thus, no sequential logic functions can be realized within the described number of groups of combinatory logic elements. However, such sequential logic functions are often necessary, for example, in order to form a master-slave organization. In order to realize such sequential logic functions there is provided an integrated logic circuit comprising at least one first number and one second number of groups of combinatory logic elements of the described kind, at least one data output of at least one of the groups within said first number and at least one data input of at least one of the groups, within said second number being interconnected in order to control said first number by a first clock pulse cycle and said second number by a second clock pulse cycle which alternates with said first clock pulse cycle. Thus, series-connected cascades are obtained, the first cascase being activated during the first half clock pulse cycle and the second cascade during the second half clock pulse cycle. The interconnection of the first and second numbers can be performed in various ways. Preferably, said number of groups of combinatory logic elements forms a two-dimensional logic array in that from said numbers of groups there are formed at least one third number and one fourth number of groups of combinatory logic elements, a data output of each group within said third number being connected to a data input of a group within said fourth number, a data input of each group within said fourth number being connected to a data output of a group within said third number, said third number of groups and said fourth number of groups being sampled in mutually-exclusive phases of said further phases, so that each group of said third number is sampled in an earlier phase than each group of said fourth number. The use of two such two-dimensional logic arrays is becoming customary. A typical example is described in the article by N. F. Benschop en L. C. M. Pfennings "Compact NMOS array multipliers with inverting full adders", Philips J. Res. 36 (1981), No. 3), pages 173-194. In such an environment, in which the construction of the circuit is usually regular, the invention enables faster operation. Moreover, it has been found that the clock circuit(s) require only little additional surface area on the substrate. Moreover, for the same processing speed, the dissipation is lower than in the case of other solutions. It is to be noted that the two-dimensional logic array need not necessarily have a regular configuration; the latter is often determined also by the space available on the substrate.

The invention also relates to a clock circuit for the control of an integrated circuit of the described kind. This clock circuit can be simply integrated.

BRIEF DESCRIPTION OF THE DRAWING

The invention will be described in detail hereinafter with reference to the drawing, in which.

DESCRIPTION OF THE PREFERRED EMBODIMENTS

Figure 1:
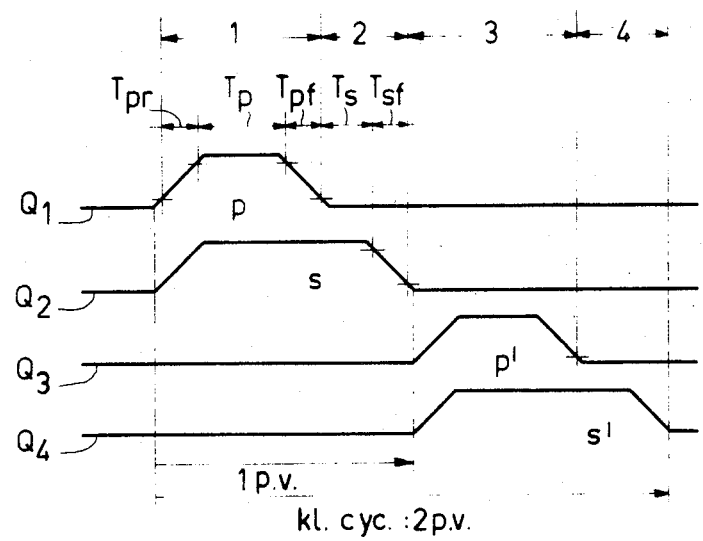
FIG. 1 shows the clock signals of the known 4-phase logic.

In the drawing, the symbols Q and Q' are used to denote the clock pulse phases.

FIG. 1 shows the clock signals of the known four-phase logic, for example, as described in the literature. The curves Q1 ... Q4 represent four clock pulse phase signals applied on associated lines. During a first phase, the signals Q1 and Q2 become "high". The latter signal has a value of, for example, +12 volts, but lower values such as +5 volts are also permissible. The other signal has a value of, for example, approximately 0 volts. When use is made of n-MOS-transistors, the discrimination or threshold level is then situated at approximately from 1 to 2 volts. At the end of the first clock pulse phase, the signal Q1 becomes low again; the various phases are denoted by the reference numerals 1 through 4 at the top of the figure. At the end of the second clock pulse phase, the signal Q2 becomes low again. At the beginning of the third phase, the signals Q3 and Q4 become high; however, the signal Q2 must then definitely be low; therefore, usually a short interval is inserted. At the end of the third phase, the signal Q3 becomes low again. At the end of the fourth phase, the signal Q4 becomes low again. Subsequently, the cycle recommences. The "third" clock pulse phase per se could also be considered as being the "first" clock pulse phase.

During the first phase, the capacitance of a node can be precharged to a high potential under the control of the clock pulse Q1. During the second phase, such a node may be sampled; depending on whether a function to be formed is "true" or not, the relevant node is discharged or not. During the third and the fourth phase, this information is then "valid" and can be used for the formation of further logic functions. Another type of gate is precharged during the first and the second phase by the signal Q2 and is sampled during the third phase by the signal Q3; the relevant value is then valid for further use during the fourth phase. The known system thus comprises four types of gates whereby a variety of logic expressions can be generated. If desirable, two of such expressions can be generated within one cycle, because the first and the second half of the cycle each allow for one operation. The duration of a cycle then amounts to two gate delay times. A comparison of this dynamic technology with a static technology reveals that the latter is comparatively fast. It has been found, for example, that for a fan-out of 4 a static gate delay of 3 ns can be achieved. In a comparable dynamic circuit, however, the clock pulse edges have a length in the order of magnitude of 10 ns and the intervals between successive clock pulse edges have a length in the order of magnitude of 5 ns. Therefore, the half clock pulse period of FIG. 1 readily amounts to 40 ns. For a slightly different shape of the clock pulses, this period may even be longer. It is an additional drawback that only a limited part (approximately ⅛) of this period is used for the actual sample operation performed to produce the logic expressions.

Figure 2:
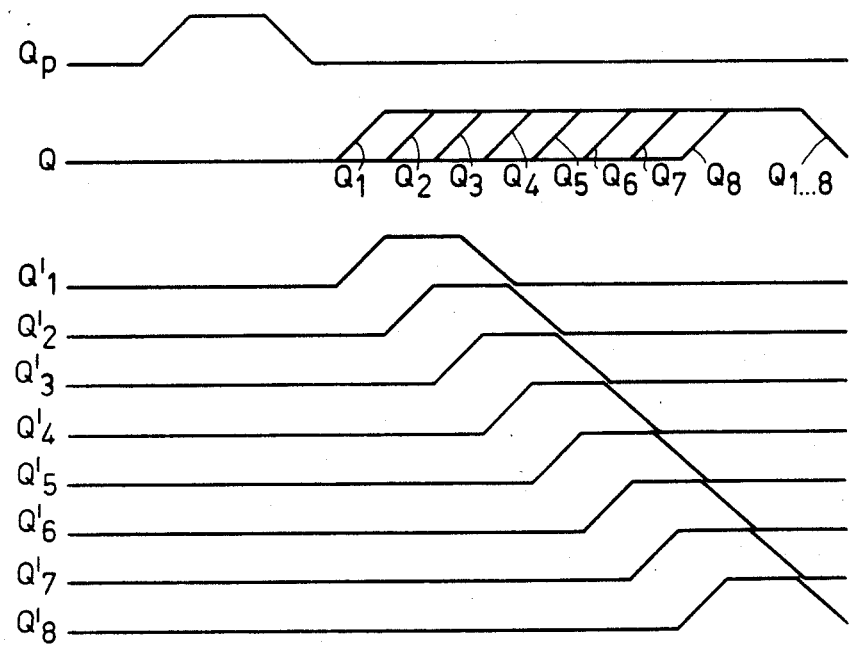
FIG. 2 shows an example of clock signals in accordance with the invention.
Figure 3A:
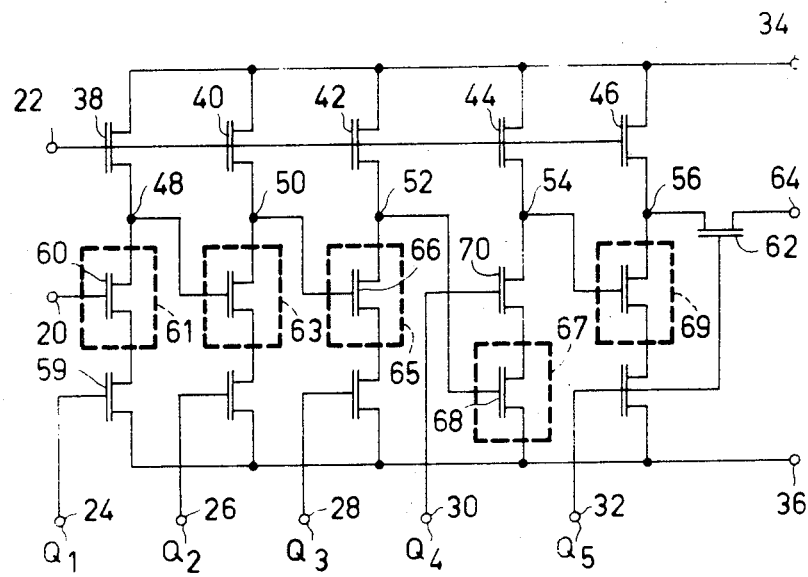
FIG. 3a shows a first elementary embodiment of a circuit in accordance with the invention.

FIG. 2 shows examples of clock signals in accordance with the invention. In a first system, useable with an arrangement as shown in FIG. 3a, in the first phase, one precharge phase is followed by a succession of sample phases. The cycle of FIG. 2 shows eight such sample phases, although FIG. 3a would only need five of them. The precharge operation is performed by the signal Qp which is applied in parallel: all nodes sample during this clock cycle are thus precharged together. These nodes may thus be divided into eight groups as will be explained hereinafter. The second line shows the eight remaining clock signals which are successively activated during the same clock cycle. First the clock signal Q1 appears, which samples, using a high potential, the first group of nodes representing a first group of logic gates. When the relevant signal Q1 has been high for a brief period of time, the second clock signal Q2 appears in order to sample the second group of nodes (representing a second group of logic gates). When the signal Q2 has been high for a brief period of time, the signal Q3 similarly appears for a third group of logic gates/nodes. This continues until the last signal $Q_N$ (in this case N has the value 8) appears. Subsequently, all signals Q1, Q2, . . ., Q N become low together, the relevant clock cycles thus being terminated. The next clock cycle may subsequently commence. The logic functions thus formed may be temporarily stored in one or more sequential logic elements.

FIG. 2 illustrates that the leading edge of the clock signal Q(n+1) may commence when the clock signal Q(n) has completely reached the high level (which means that it passes the associated discrimination level). Sometimes it is advantageous to introduce a short interval. If the end of a positive-going edge also indicates the beginning of a next clock pulse phase, the time intervals between the successive further clock phases Q1 . . . Q8 will then have a length which corresponds substantially to the length (duration) of a leading edge. The duration of the phase Q8 is longer because of the necessary trailing edge. A clock pulse system of this kind will also be referred to hereinafter as a "ripple" clock pulse system. It is to be noted that for N=1 the clock system of FIG. 2 could be functionally reduced to one half period of the previously-described dynamic logic, although without overlap.

The next eight lines show a different embodiment: the pulse shape of all clock signals Q'1 . . . Q'8 is mutually congruent. This offers an advantage in given cases.

However, the former solution offers the following advantage: the sample pulse keeps the nodes which obtain a low level in a function tree continuously grounded. This so-called "hard" zero is less sensitive to cross-talk than a "zero" embodied only in a charge stored in the node at the end of a sample pulse.

However, in dynamic MOS-technology the high voltage level (i.e. representing a "one") is always "floating" after termination of the precharge pulse. However, this is less critical for two reasons. First of all, such a high voltage level per se is comparatively insensitive to disturbances, because it is situated further from the associated discrimination level than the low voltage level. Secondly, the disturbances influencing the high voltage level can be easily compensated for. This is because the voltage could be reduced by control of the subsequent gates. This is remedied by increasing the dimensions of intersections with subsequent clock lines (i.e. clock lines "associated" with the control of subsequent clock phases) as desired: the positive-going clock pulse edges produce a positive cross-talk which restores the high level. Consequently, the control voltage remains high and the discharge time of the gates controlled remains short. It has been found that delays of 10 ns are also feasible for 3-input NAND-gates by using compact transistors of square shape.

Evidently, one or more phases of the series Q'1 . . . Q'8 can be omitted in order to increase the separation between successive clock phases.

Figure 3B:
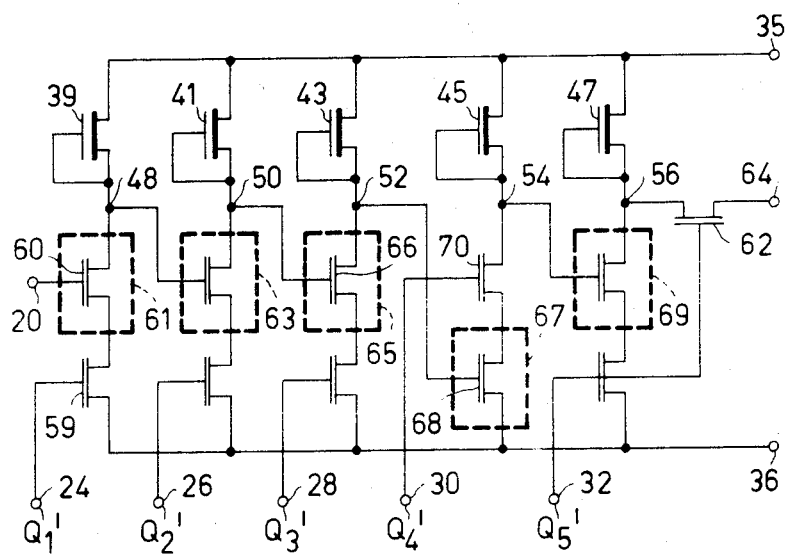
FIG. 3b shows a second elementary embodiment of a circuit in accordance with the invention.

FIG. 2 is also used to explain a clock-pulse arrangement to be used in connection with the circuit of FIG. 3b. Here, instead of a charge procurement means activated by precharge pulse Qp, a self-activated arrangement is used. The sequence of sample pulses may be according to pulses $Q_1'$ through $Q_2'$. As with respect to FIG. 3a, again a sequence of five sample clock pulse phases per clock pulse would be sufficient. Again, as soon as clock pulse $Q_1'$ is high, the leading edge of clock pulse $Q_2'$ commences. The trailing edge of clock pulse $Q_1'$ may start a short time after clock pulse $Q_2'$ has reached the high level. Clock pulse $Q_1'$ could be prolonged somewhat, but this would lead in additional energy dissipation and would serve no real advantage.

FIG. 3a shows a first elementary embodiment of a circuit in accordance with the invention. This circuit comprises a data input 20, a parallel clock pulse input (Qp) 22, and five clock pulse inputs 24–32 for a ripple clock pulse system with clock pulses Q1 . . . Q5, or $Q_1'$ . . . $Q_5'$. The appropriate power supply voltage is present on terminal 34, and terminal 36 is connected to ground potential. When terminal 22 is high, all precharge transistors 38–46 become conductive, so that the nodes 48 . . . 56 are precharged to a high potential. When the clock pulse Q1 appears and a high potential ("1") is received on terminal 20, the node 48 is discharged to a low potential because the series connection of the transistors 59 and 60 becomes conductive. The transistor 60 in the square denoted by broken lines symbolizes an AND/OR/INVERSION function and thus forms only the inherent inversion in this case. Logic functions to be formed by MOS-transistors are known and will not be elaborated herein for the sake of brevity. The next four stages of the circuit also comprise only the inherent inverters for the sake of simplicity, so that the entire circuit represents only one inversion function. In the fourth stage the sample transistor 70 is connected between the precharge node 54 and the transistor 68 which symbolizes and represents the "group" of combinatory logic elements. It appears that in given cases (see hereinafter) a group of combinatory logic elements can thus be sampled which has a larger logic depth, for example, more than one AND/OR/INVERSION function in series. This feature is endangered only a little because, due to the fact that the transistor 70 remains conductive (compare the sample pulses in FIG. 2), a given degree of charge-sharing occurs with respect to the node 54. In this case the clock pulse Q6 is the last pulse which also drives the transistor 62 so that the output information appears on terminal 64. The function blocks (logic tree) within the blocks denoted by broken lines may be combined in a different manner, for example, in that the node 48 drives several transistors which are not controlled by the directly subsequent clock pulse phase, for example, a transistor connected in series with the transistor 66; the relevant signal then skips one stage. A circuit as shown in FIG. 3a will usually comprise several signal inputs from the environment and also several signal outputs to the environment. The latter are also provided with a gating transistor such as the element 62 (possibly controlled by another clock pulse phase). An alternative solution for the use of a gating transistor 62 is the insertion of a dynamic, sequential logic element. These elements are sufficiently disclosed in the literature.

Using the clock pulse cycle of FIG. 2, the circuit shown in FIG. 3a may thus comprise eight groups of combinatory logic elements. When more of such circuits are driven by the same clock system, a choice can be made when a number smaller than the maximum feasible number of groups is present within a given circuit. For example, the circuit of FIG. 3 can also be driven by the clock signals Q1, Q3, Q5, Q6, Q8.

FIG. 3b shows a second elementary embodiment of a circuit in accordance with the invention. Except for the difference in the charge procuring means (39, 41, 43, 45, 47) the circuit is a copy of FIG. 3a, and corresponding elements are numbered with the same reference numbers. The clock pulse terminals are controlled with the clock pulses $Q_1'$ ... $Q_5'$ from FIG. 2. Element 39 is a depletion transistor, as indicated by a fatter line than other transistors. Thus pull-up transistor in combination with the power source connected to terminal 35 constitutes a high impedance current source. In consequence, if terminal 20 receives a logic "1", clock pulse $Q_1'$ causes a direct current path between power terminals 35 and 36, transistor 39 operating as a limiter. Upon the next clock pulse $Q_2'$ the voltage of node 48 controls the information value to the present on node 50. A short time after the establishment of the latter, clock pulse $Q_1'$ may be terminated: its function has been fulfilled and lengthening the clock pulse would only cause additional dissipation. For the remainder of the circuit, the operation compares to FIG. 3a. Thus no charge-sharing between two floating nodes occurs, such as in FIG. 3a (e.g. between node 50 and the gate capacitance of transistor 66): both logic levels now are "hard". Furthermore, the omission of the precharge clock pulse diminishes the area required for the arrangement: both the clock circuit proper and the clock distribution lines may be omitted. Finally, the redesign according to FIG. 3b starting from a static design is elementary. One disadvantage is the increased dissipation of FIG. 3b with respect to FIG. 3a, although it is much less than it would have been if executed in fully static logic.

Figure 4:
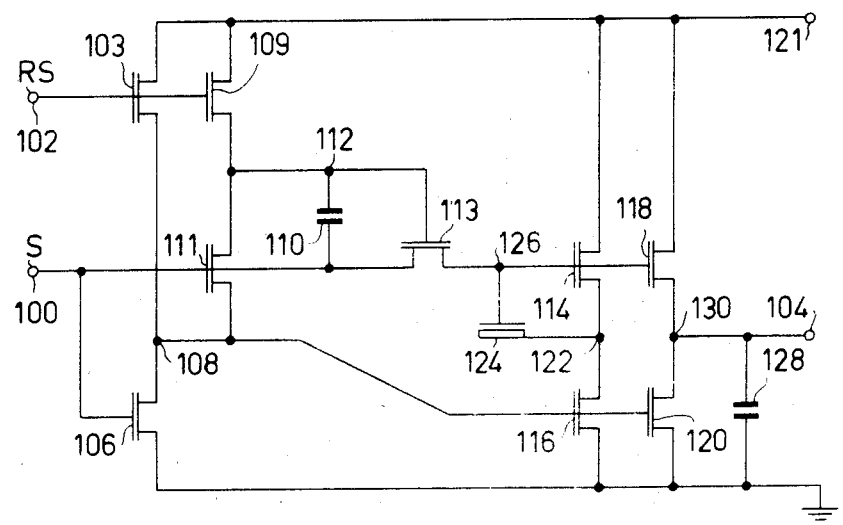
FIG. 4 shows a circuit for generating the ripple clock pulses.
Figure 5:
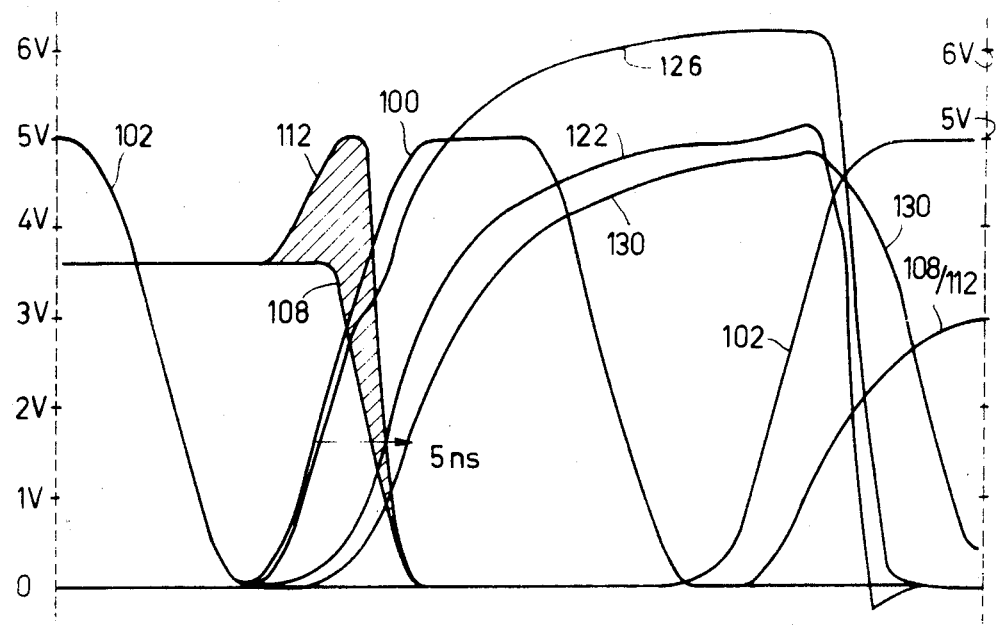
FIG. 5 shows a number of electrical waveforms therein.

FIG. 4 shows a circuit for generating one of the ripple clock pulses with a low dissipation in accordance with FIG. 2. FIG. 5 shows a number of electrical waveforms in this circuit. All transistors used are of the so-called enhancement type and can be integrated in a customary manner. Input 100 receives a set signal in the form of a positive-going edge which is formed, for example, by the inverted signal Qp. In that case the time delay between the negative-going edge of the signal Qp and the positive-going edge of the signal Q1 or Q'1 is smaller than shown in FIG. 2: the latter edge starts when the former edge ceases. The positive-going signal edge received by the circuit of FIG. 4 on input 100 is applied to output 104 after a brief delay, thus forming the clock signal Q1. For a clock system as shown in FIG. 2, second line, eight series-connected circuits as shown in FIG. 4 are required. A positive-going edge of a reset signal (for example, the signal Qp) on the relevant inputs 102 causes all signals Q1 ... Q8 to become low again together; a reset operation is thus performed.

Prior to the reception of the positive-going signal edge, first the node 112 is precharged by way of a high signal on the input 102 ("reset"). Subsequently, the input 102 is maintained at a low level (see curve 102 in FIG. 5; the curves bear the same number as the associated node/connection). When the terminal 102 is low again, the transistors 103 and 109 remain cut off: terminal 121 is connected to a positive power supply source. When the input 100 subsequently becomes high ("set"), the transistor 106 becomes conductive and node 108 becomes low. The capacitor 110 temporarily serves as a bootstrap capacitor, so that the node 112 has an increased potential for a brief period of time. Consequently, the further bootstrap capacitor 124 which acts as an output transfer capacitor is charged from input 100, via the transistors 113 and 116. Each of the transistor pairs 114/116 and 118/120 is activated by mutually inverse drive voltages; the low potential on node 108 blocks the transistor 116, and the potential of node 122 follows the rise of the potential on node 126. In this embodiment the bootstrap capacitor 124 is constructed as a conventional MOS-transistor. Consequently, the potential of the node 126 becomes high, that is to say higher than the power supply voltage on the terminal 121, so that the transistors 114 and 118 are quickly turned on. For this purpose the transistor 113 must be turned off again after the charging of the capacitor 124. However, this takes place in time because the node 112 is discharged via the transistor 111. The latter is conductive as soon as the potential on the input terminal (node) 100 has increased sufficiently with respect to the potential of the node 108, which has meanwhile decreased. Bootstrap capacitor 124 is thus charged during the delay time of the inverter 106. The transistors 118, 120 are so-called enhancement transistors and form a push-pull output stage. One and only one of these two transistors is conductive in order to prevent the occurrence of a direct current path between power supply connection and ground; dissipation is thus reduced. The transistors 118, 120 have a surface area which is larger than that of the transistors 114/116, so that they can supply a larger output current for the fast charging/discharging of the symbolically denoted load capacitor 128. For the time being the termination of the high signal on the input 100 has no effect on the value of the output signal (node 130); this output signal increases further for the time being after acceleration of the initial rise by the addition of the bootstrap capacitor 124. However, when the reset signal on the input 102 subsequently becomes high (input 100 is low again), the nodes 108 and 112 become high and the nodes 126, 122 and 130 become low again. It is to be noted that FIG. 5 concerns a customary computer simulation. For a clock system as shown in FIG. 2, the circuit of FIG. 4 should be present in 8-fold. The output 104 is then applied to the relevant clock pulse input of the circuit shown in FIG. 3 and, moreover, to the data input of the successive eight clock pulse generator circuits. The set pulse for the first one of these eight circuits and the reset pulse which is applied to all circuits are generated in a conventional manner; for example, they are formed by the inverted and the non-inverted Qp, respectively.

Representative dimensions of the relevant transistors in the circuit of FIG. 4 will be given in microns hereinafter; the first value concerns the width and the second value concerns the length:

103, 106, 109, 111: 5/3
114, 116: 12/3
113: 20/3
124: 20/20 (MOS-capacitor)
118, 120: 30/3

This is merely one feasible embodiment; the capacitor 110 is formed by the capacitance between the gate electrode and the source electrode of the transistor 113.

Figure 6:
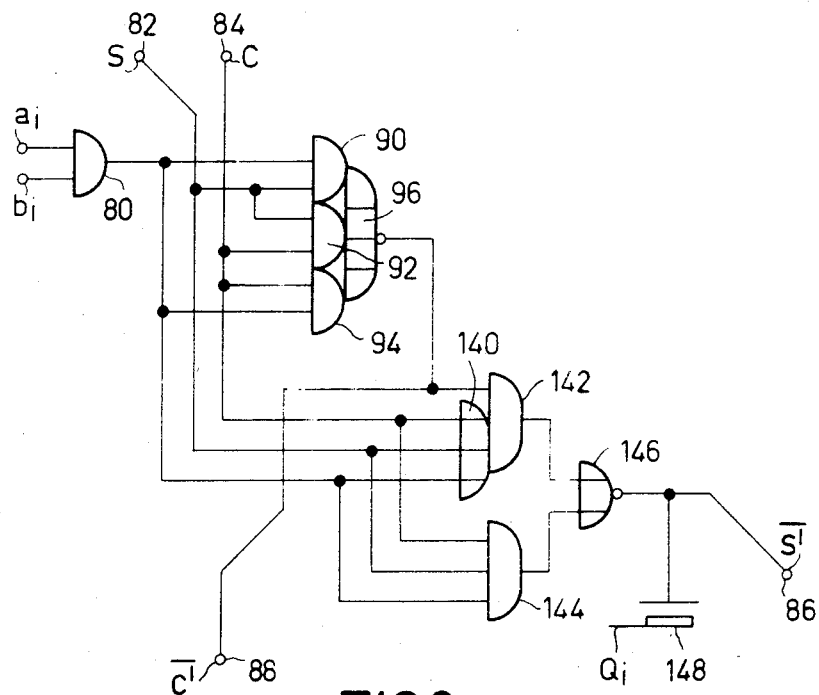
FIG. 6 shows an example of a logic circuit for use in a full adder.

FIG. 6 shows an example of a combinatory logic circuit representing an inverting full adder. An additional input gate 80 is added thereto in order to form a (N)AND-function. Such a logic circuit is intended for use in a so-called array multiplier. The use of inverted signals on the output is described in the above article; the omission of additional output inverters (in order to obtain non-inverted output signals again) offers advantages in view of higher processing speed, lower dissipation and smaller surface area of the associated integrated circuit. The circuit shown in FIG. 6 is given by way of example and is not detailed to the level of the logic gates. The operation of precharge signals and sample signals is not shown either in this Figure. The NAND-gate 80 (with the associated inverter), if necessary, does not form part of the actual circuit and will be described in detail with reference to FIG. 7. Terminals 82, 84 receive the signals "sum" and "output carry" which are applied to the relevant circuit from similar circuits of the same or next-lower significance level, respectively. On output 86 the inverted value of the sum modulo-2 of the input signals (S, C, $P=a_i \times b_j$) is formed; this inverted value has the value "1" if an even number of input signals have the value "1". If no more than one input signal has the value "1", the output signal $\overline{C}'$ on output 88 has the value "1". If necessary, the output 88 is connected to a "C" input of such a circuit of a next-higher significance. The signal $\overline{C}'$ is formed by three parallel AND-gates 90, 92, 94 which are connected to an OR-gate 96 having an inverting output. The signal $\overline{S}'$ is formed by an OR-gate 140, AND-gates 142, 144 and an OR-gate 146 having an inverting output. For the formation of the signal $\overline{S}'$ use is also made of the signal $\overline{C}'$. Consequently, only a single polarity is required for all input signals; this allows for a very compact layout. As a result, the logic depth (gate 80 is not considered) is increased to two, because now there are two series-connected AND/OR/INVERSION-functions. Generally two successive sample clock signals would then be required. However, it has been found that the use of only one sample clock signal suffices, provided that the output of the signal $\overline{S}'$ is sampled after a slight delay. This can be realized in various manners. In first realization, the signal $\overline{S}'$ is maintained at a "high" level for some additional time by an additional step involving a so-called compensation capacitor 148; the latter then conducts the positive-going edge of the relevant sample clock signal. Another way of achieving this delay is to interchange the sequence of sample transistor and combinatory logic elements (compare the parts 68 and 70 in FIG. 3).

The full adder circuit shown in FIG. 6 in MOS-technology, except for the gate 80, requires only two AND-/OR/INVERSION functions, i.e. one for $A\overline{C}'$ and one for $\overline{S}'$. The entire circuit shown in FIG. 6 is thus sampled by a single sample pulse as shown in FIG. 2 when it is included as a stage (within a box of FIG. 3 which is denoted by broken lines).

Figure 7:
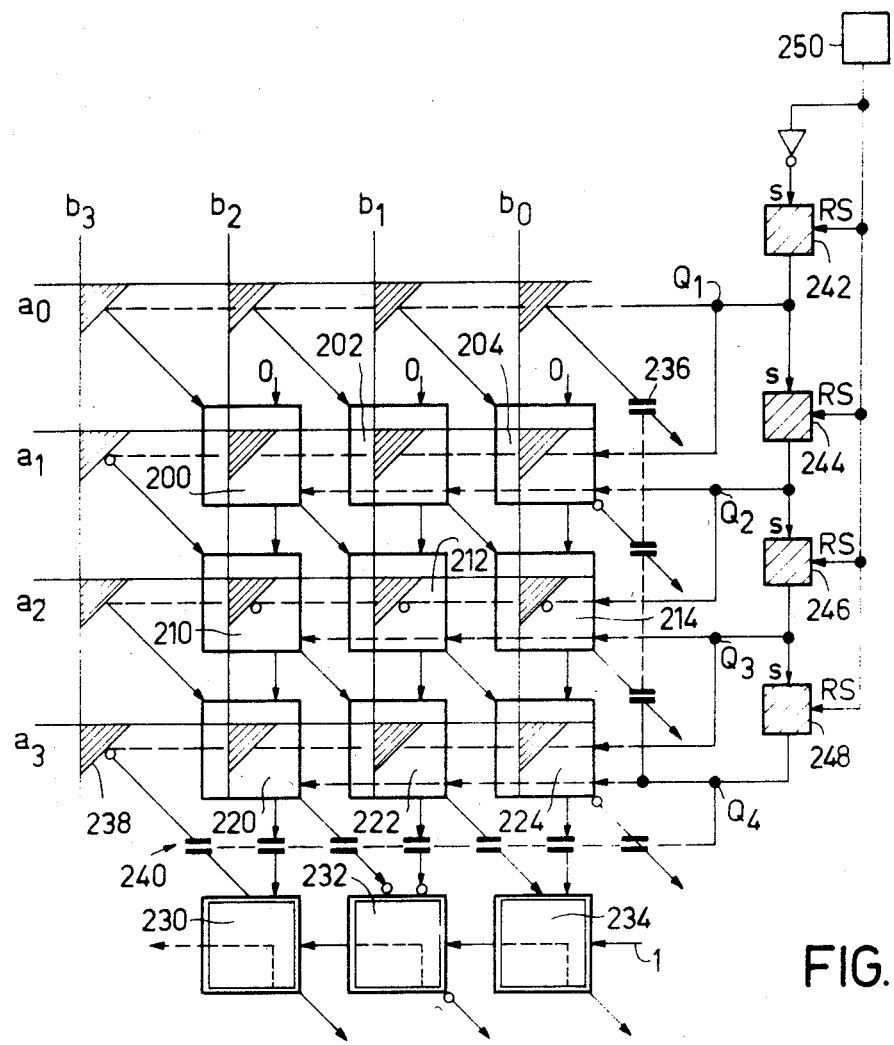
FIG. 7 shows a two-dimensional array of groups of combinatory logic elements.

FIG. 7 shows an example of a two-dimensional array of groups of combinatory logic elements. This example concerns a multiplier array and as such it constitutes an improvement of a multiplier array of this type described in the cited article. The improvement notably concerns the use of "ripple" clock pulse control whereby the dissipation is reduced, while the operating speed remains high and the required substrate surface area small. Each of the blocks 200 . . . 224 represents a circuit as shown in FIG. 6. The two operands comprise the successive bits b3 . . . b0, a3 . . . a0, the most significant bit (b3, a3) being each time arranged in front; these bits are applied via the vertical bit lines and the horizontal bit lines, respectively. At each intersection of these bit lines either an AND-function (triangle) or a NAND-function (triangle with circle) is formed. The sum value of the full adders is transferred to the bottom right; the carry value (having the next-higher significance level) is transferred straight downwards. The blocks 230, 232, 234 are constructed as full adders in static logic in order to save surface area on the substrate necessary for clock distribution. Output carry signals from the latter blocks are transferred to the left and the sum signals are transferred to the bottom right. Each of the shaded blocks represents a clock circuit as shown in FIG. 4. The blocks 200–204, 230–234 also receive a fixed input signal with the indicated value 0,1 as a calculation variable. Small circles denote the signals to be inverted. Indications such as given at 236 and 240 denote hold elements for storing the data bits until the end of the clock cycle. Element 238 is a logic NAND-gate. An 8-bit output data can thus be formed. The circuit can be reliably controlled by way of a clock cycle as shown in FIG. 2 which need comprise only four sample signal pulses in this example, i.e. as many pulses as there are bits in the operand (a3, a2, a1, a'). The delay between two successive sample edges must be slightly larger than the delay caused by the operation of a full adder. Integration of the clock circuits (242 . . . 250) with the circuits of the logic array renders the operation of the assembly less dependent on parameter variations caused by a spread in the tolerances due to the technology. The clock pulse Q1 samples the upper two rows of AND/NAND-gates and the first row of blocks 200–204; the clock pulses Q2, Q3 each time sample a line of blocks such as (200–204) plus the AND/NAND-gates on the directly succeeding line. The clock pulse Q4 samples the lowermost row of dynamic blocks (220–224) plus the column (236) of hold elements and the row (240) of hold elements. The larger the number of operand bits (a0 . . . a3), the greater the gain in speed will be in comparison with, for example, a two-phase clock system. This is because the precharge operation is performed only once in parallel and all negative-going edges of the sample pulses coincide. The static dissipation of 0.5 mW per array cell is avoided. In NMOS-technology with a line width of three microns a density of 100 cells (200–224) per mm$^2$ can be easily achieved.

Figure 8:
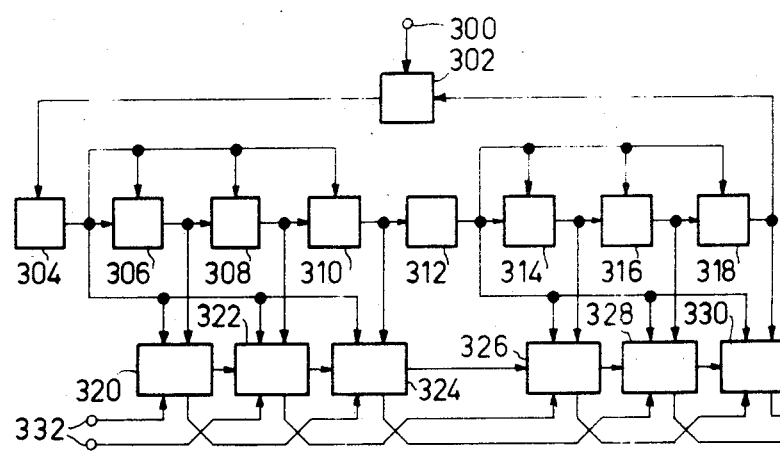
FIG. 8 shows a block diagram of two series-connected cascades of groups.

FIG. 8 shows a block diagram of two seriesconnected cascades of groups of combinatory logic elements. Each cascade comprises three groups of combinatory logic elements, i.e. 320–324 and 326–330. The data signals arrive on inputs 332 and output signals appear on connections 334. The logic operations will not be described for the sake of simplicity. The output signals of the group 320 are applied to the next group 322 and also to the next group but one 324, and so on for all other groups. The precharge pulses are formed by the circuits 304, 312 and the sample pulses are formed by the circuits 306–310, 314–318. The circuits 304–318 are connected in a network for which the circuits 304, 312 supply the necessary reset pulses. Element 302 is a gate-/activation circuit. When this element is conductive, the output of block 318 is fed back to the input of block 304 and the odd/even half clock pulse cycles continuously succeed one another. When the element 302 is blocked by a signal on the input 300, the clock pulse cycles cease. The next clock pulse cycle is activated again, for example, by a pulse signal on the input 300 (for example, from a master clock).

What is claimed is:

1. A multiphase MOS integrated circuit comprising a plurality of groups of combinatory logic elements for forming in each group an associated AND/OR/INVERSION function, at least one data output terminal of each group being coupled to a data input terminal of at least one other group, the groups thereby being connected in a cascade of groups, said integrated circuit comprising clock means for generating multiphase clock pulse signals each having a leading edge with a finite rise time, at least one clock pulse per cycle controlling a sample operation, said circuit comprising a plurality of precharge transistors each having a control input for receiving a precharge control pulse in a first clock phase from said clock means for precharging a plurality of nodes, the circuit having a plurality of clock inputs for receiving from said clock means associated respective clock pulses during successive clock pulse phases as sample clock pulses for associated successive groups, so that within said cascade of groups a preceding group in the cascade is always sampled in an earlier phase than any successive group in the cascade, and said clock means having a plurality of delay means for generating said successive clock pulse phases at intervals with a lower bound that is substantially equal to the length of the leading edge of a sample clock pulse.

2. An integrated circuit as claimed in claim 1 characterized in that it is constructed in NMOS-technology.

3. An integrated circuit as claimed in claim 1 or 2, characterized in that for at least one group a sample transistor is connected between the precharge node and the combinatory logic elements of this group.

4. An integrated circuit comprising at least one first number and one second number of groups of combinatory logic elements as claimed in claim 1 or 2, characterized in that at least one data output of at least one of the groups within said first number and at least one data input of at least one of the groups within said second number are interconnected in order to control said first number by a first clock pulse cycle and said second number by a second clock pulse cycle which alternates with said first clock pulse cycle.

5. An integrated circuit as claimed in claim 1 or 2, characterized in that said plurality of groups of combinatory logic elements form a two-dimensional logic array in that from said plurality of groups there are formed at least one first number and one second number of groups of combinatory logic elements, a data output of each group within said first number being connected to a data input of a group within said second number, a data input of each group within said second number being connected to a data output of a group within said first number, said first number of groups and said second number of groups being sampled in mutually exclusive phases, so that each group of said first number is sampled in an earlier phase than each group of said second number.

* * * * *